United States Patent
Nakatani et al.

(10) Patent No.: US 9,853,439 B2
(45) Date of Patent: Dec. 26, 2017

(54) GROUND FAULT DETECTION CIRCUIT, ABNORMALITY DETECTION CIRCUIT, LIGHT EMITTING DEVICE, VEHICLE

(71) Applicant: Rohm Co., Ltd., Kyoto (JP)

(72) Inventors: Yoshiyuki Nakatani, Kyoto (JP); Shinsuke Takagimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/581,260

(22) Filed: Apr. 28, 2017

(65) Prior Publication Data

US 2017/0331272 A1    Nov. 16, 2017

(30) Foreign Application Priority Data

May 10, 2016   (JP) ................. 2016-094818

(51) Int. Cl.
| | |
|---|---|
| *H05B 33/08* | (2006.01) |
| *H02H 3/16* | (2006.01) |
| *H02H 1/00* | (2006.01) |
| *B60Q 1/04* | (2006.01) |
| *B60Q 1/34* | (2006.01) |
| *B60Q 1/44* | (2006.01) |
| *G01R 31/02* | (2006.01) |

(52) U.S. Cl.
CPC ............... *H02H 3/16* (2013.01); *B60Q 1/04* (2013.01); *B60Q 1/34* (2013.01); *B60Q 1/44* (2013.01); *G01R 31/025* (2013.01); *H02H 1/0007* (2013.01); *H05B 33/083* (2013.01); *H05B 33/089* (2013.01)

(58) Field of Classification Search
CPC .......... H02H 3/16; H02H 1/0007; B60Q 1/04; B60Q 1/34; B60Q 1/44; H05B 33/08; H05B 33/083; H05B 33/089
USPC .... 315/77–82, 185 R, 209 R, 210, 224–226, 315/291, 307, 308, 312
See application file for complete search history.

(56) References Cited

U.S. PATENT DOCUMENTS

| | | |
|---|---|---|
| 2012/0074845 A1 | 3/2012 | Aoki et al. |
| 2013/0313973 A1 | 11/2013 | DeNicholas et al. |

(Continued)

FOREIGN PATENT DOCUMENTS

JP        2012-071712        4/2012

OTHER PUBLICATIONS

European Patent Office, Partial European Search Report dated Oct. 5, 2017 in European Patent Application No. 17170438.0.

*Primary Examiner* — Jimmy Vu (74) *Attorney, Agent, or Firm* — Fish & Richardson P.C.

(57) ABSTRACT

A light emitting device includes a series connection unit constituted of N light emitting elements, a light emitting element driving circuit having an output terminal connected to an anode of the series connection unit, N short-circuit switches respectively connected in parallel to the light emitting elements, and a switch control unit arranged to control on and off of the short-circuit switches. A ground fault detection circuit, which detects a ground fault of the light emitting device, includes a reference voltage source arranged to generate a reference voltage, and a comparator arranged to compare the anode voltage of the series connection unit with the reference voltage. The reference voltage has a value smaller than the product of an on-resistance of one of the short-circuit switches and output current of the light emitting element driving circuit.

19 Claims, 11 Drawing Sheets

(56) References Cited

U.S. PATENT DOCUMENTS

| | | |
|---|---|---|
| 2014/0239851 A1 | 8/2014 | Aoki et al. |
| 2015/0163871 A1* | 6/2015 | Takeshi ................. B60Q 11/00 315/82 |
| 2016/0121783 A1 | 5/2016 | Takagimoto et al. |

* cited by examiner

GROUND FAULT DETECTION CIRCUIT, ABNORMALITY DETECTION CIRCUIT, LIGHT EMITTING DEVICE, VEHICLE

CROSS-REFERENCE TO RELATED APPLICATIONS

This nonprovisional application claims priority under 35 U.S.C. §119(a) on Patent Application No. 2016-094818 filed in Japan on May 10, 2016, the entire contents of which are hereby incorporated by reference.

BACKGROUND OF THE INVENTION

Field of the Invention

The present invention relates to a ground fault detection circuit, and an abnormality detection circuit, a light emitting device, and a vehicle each using the ground fault detection circuit.

Description of Related Art

A light emitting device including a series connection unit constituted of a plurality of light emitting diodes is used as a headlight of a vehicle, for example. When it is used as a headlight of a vehicle, in order to realize an adaptive front-lighting system (AFS) or an adaptive driving beam (ADB), it is preferred to adopt a structure in which short-circuit switches are disposed and respectively connected in parallel to light emitting elements of the series connection unit, so that the number of lighted light emitting diodes can be controlled by turning on and off the short-circuit switches.

Figure 10A:
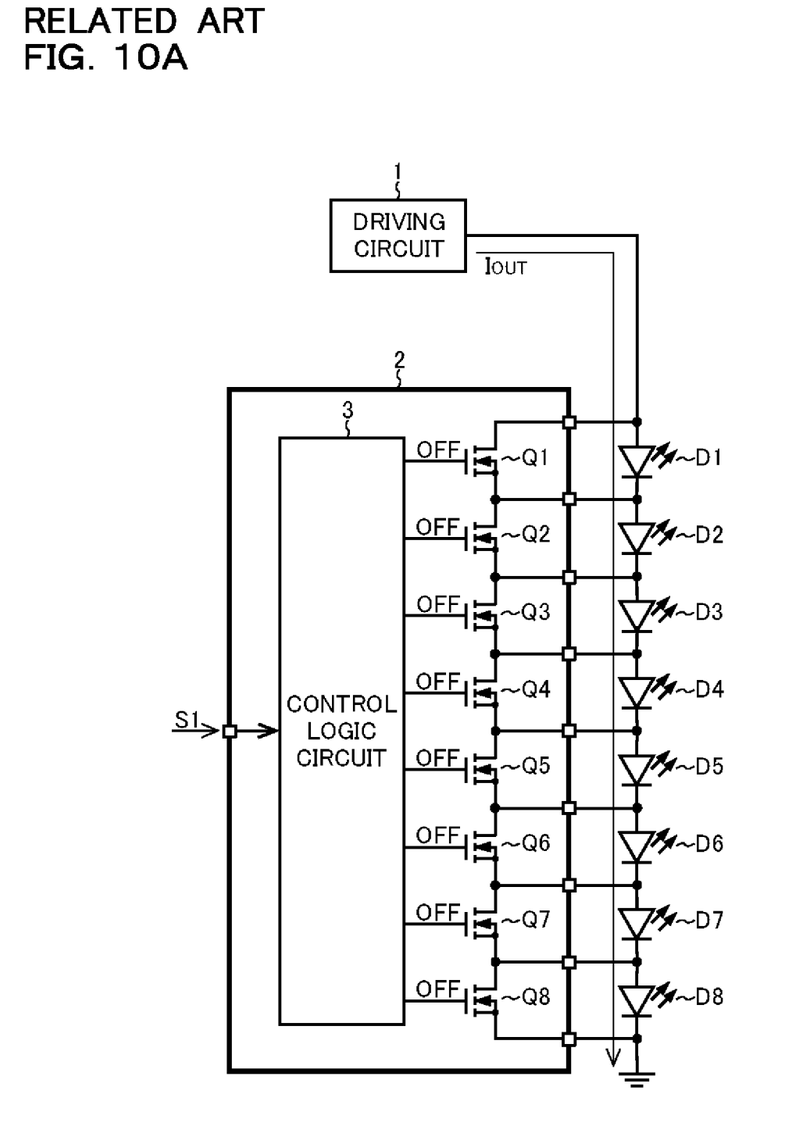
FIG. 10A is a diagram illustrating a general structural example of the light emitting device.

FIG. 10A is a diagram illustrating a general structure of a light emitting device that includes a series connection unit constituted of a plurality of light emitting diodes and can control the number of lighted light emitting diodes by turning on and off the short-circuit switches.

The light emitting device illustrated in FIG. 10A includes the series connection unit constituted of eight light emitting diodes D1 to D8, a driving circuit 1 that drives the light emitting diodes D1 to D8, and a lighted element number control integrated circuit (IC) 2 that controls the number of lighted light emitting diodes D1 to D8. The lighted element number control IC 2 includes N-channel MOS field-effect transistors Q1 to Q8 that are respectively connected in parallel to the light emitting diodes D1 to D8 so as to function as the short-circuit switches, and a control logic circuit 3 that controls on and off of the transistors Q1 to Q8 in accordance with a lighted element number indicating signal S1 supplied externally.

FIG. 10A illustrates a state where the lighted element number control IC 2 controls the eight light emitting diodes D1 to D8 to be lighted. In this case, all the transistors Q1 to Q8 are turned off, and output current $I_{OUT}$ of the driving circuit 1 flows in the light emitting diodes D1 to D8 so that the light emitting diodes D1 to D8 are lighted.

Figure 10B:
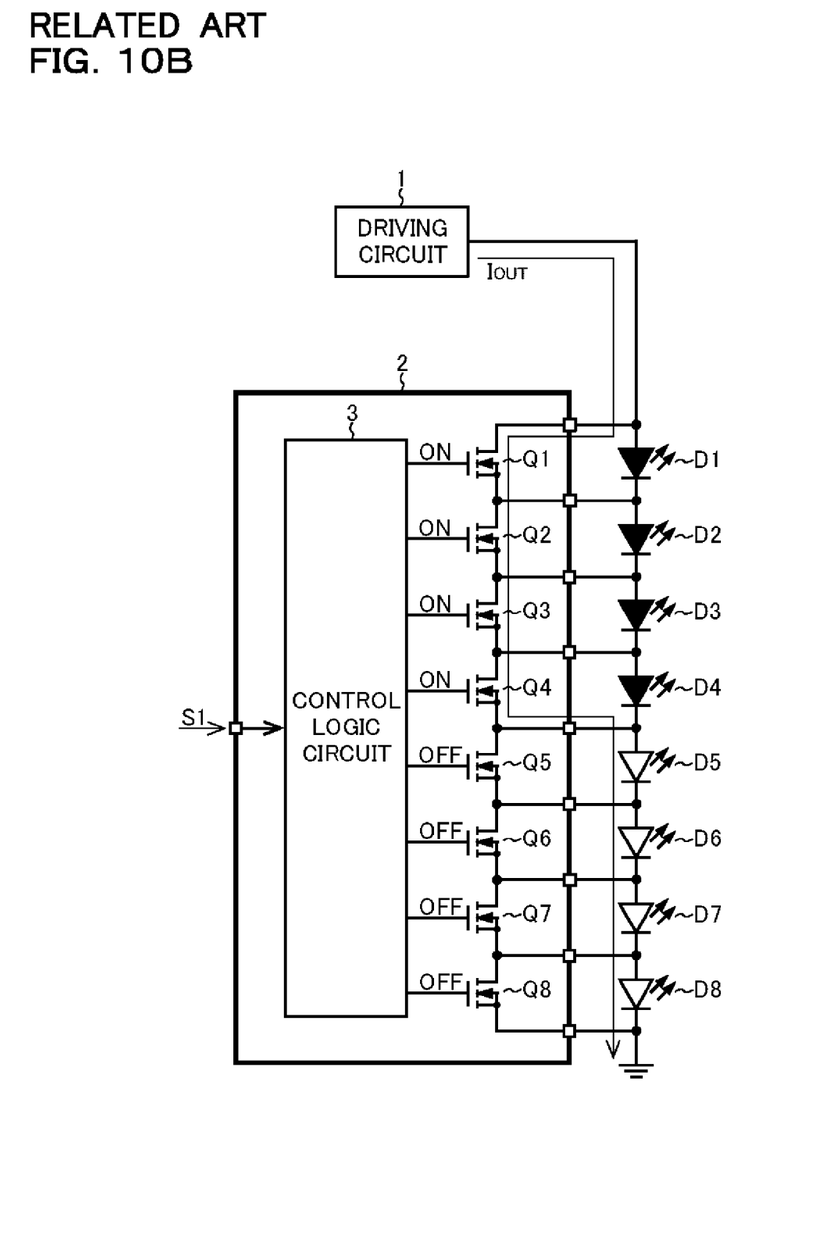
FIG. 10B is a diagram illustrating a state where the light emitting device illustrated in FIG. 10A is partially lighted.

FIG. 10B illustrates a state where the lighted element number control IC 2 of the light emitting device illustrated in FIG. 10A controls to light only four light emitting diodes D5 to D8. In this case, the transistors Q1 to Q4 are turned on while the transistors Q5 to Q8 are turned off, and the output current $I_{OUT}$ of the driving circuit 1 flows in the transistors Q1 to Q4 and the light emitting diodes D5 to D8 so that the light emitting diodes D5 to D8 are lighted.

Figure 10C:
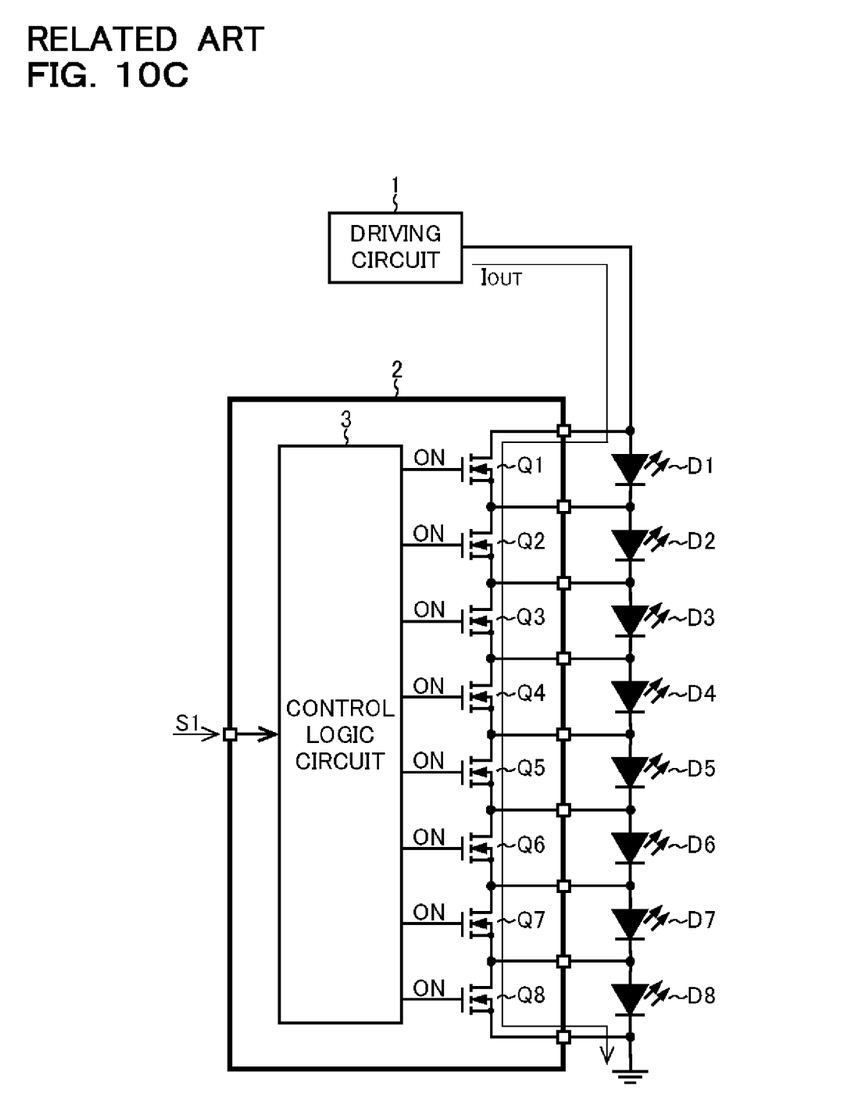
FIG. 10C is a diagram illustrating a state where the number of lighted elements in the light emitting device illustrated in FIG. 10A is controlled to be zero.

FIG. 10C illustrates a state where the lighted element number control IC 2 of the light emitting device illustrated in FIG. 10A controls the number of lighted light emitting diodes to zero. In this case, all the transistors Q1 to Q8 are turned on, and the output current $I_{OUT}$ of the driving circuit 1 flows in the transistors Q1 to Q8 so that the light emitting diodes D1 to D8 are not lighted. Note that the state illustrated in FIG. 10C can be said to be one type of ground fault state because an output terminal of the driving circuit 1 is short-circuited to the ground through the transistors Q1 to Q8, but it is not the state where a ground fault occurs without a short-circuit switch in the ground fault path.

Figure 10D:
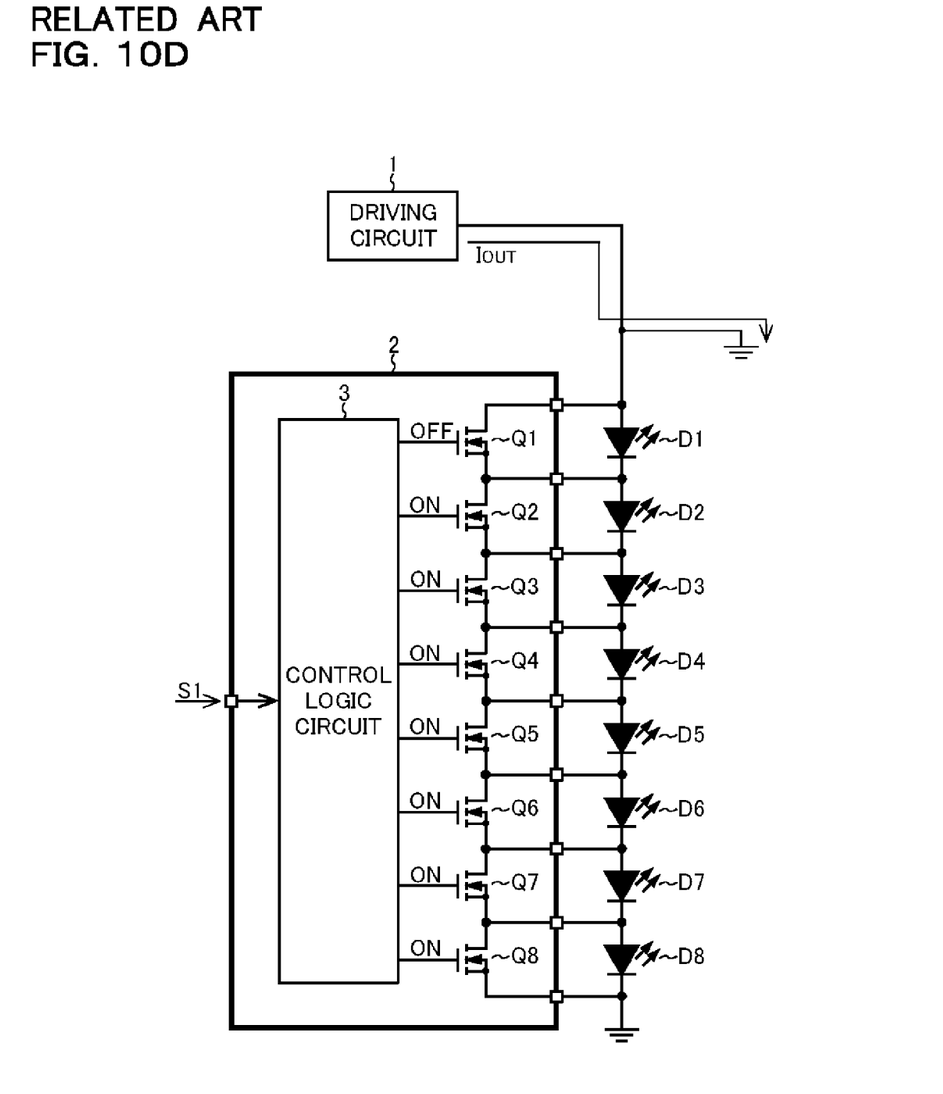
FIG. 10D is a diagram illustrating a state where a ground fault occurs without a short-circuit switch in the ground fault path in the light emitting device illustrated in FIG. 10A.

FIG. 10D illustrates a state where a ground fault occurs without a short-circuit switch in the ground fault path in the light emitting device illustrated in FIG. 10A. In FIG. 10D, the control logic circuit 3 controls the transistor Q1 to be off state, and hence the light emitting diode D1 must be intrinsically lighted. However, because of the ground fault without a short-circuit switch in the ground fault path, the light emitting diode D1 is not lighted.

Figure 10E:
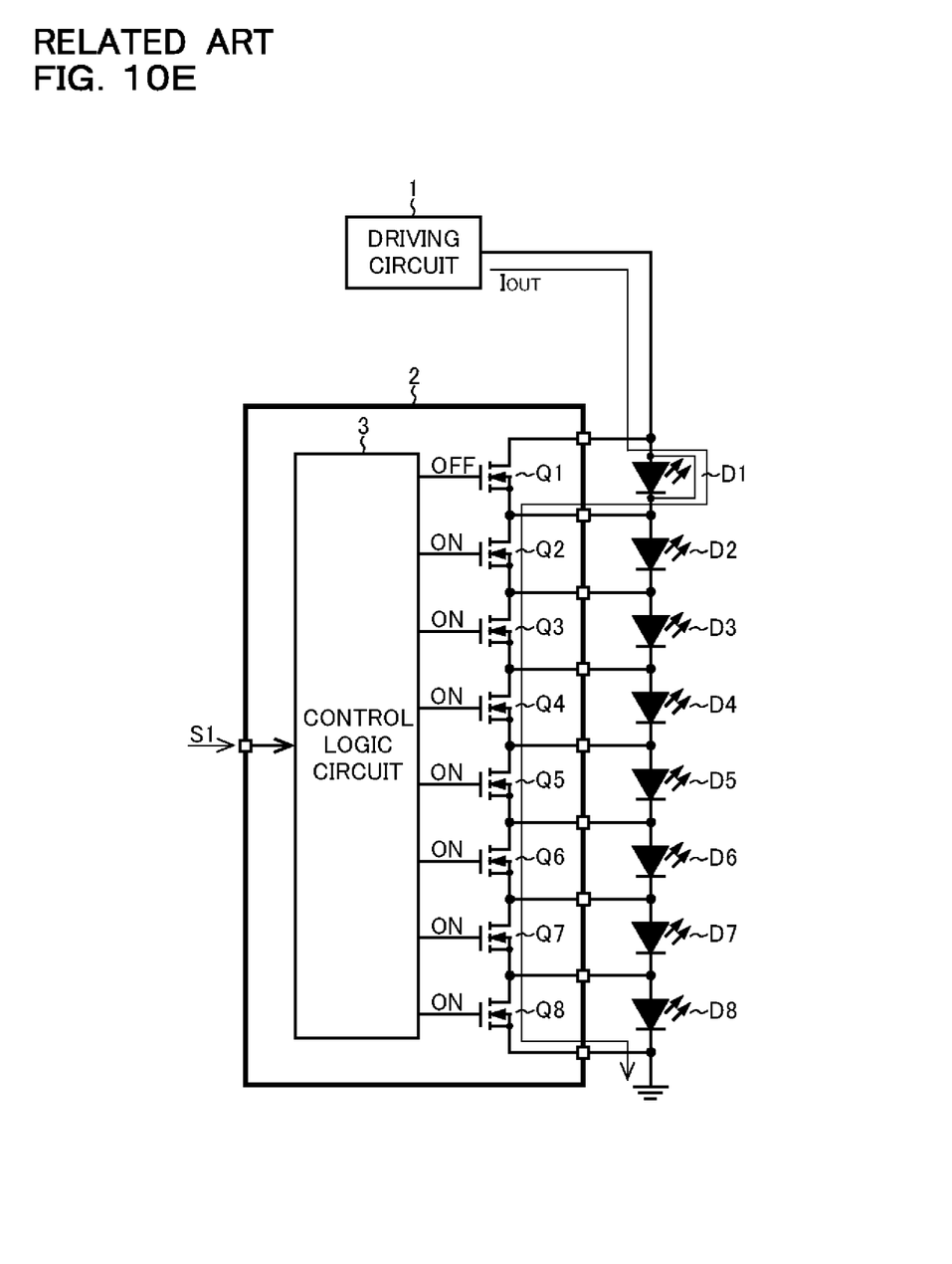
FIG. 10E is a diagram illustrating a state where a short-circuit abnormality occurs in the light emitting device illustrated in FIG. 10A.

FIG. 10E illustrates a state where a short-circuit abnormality occurs in the light emitting diode D1 in the light emitting device illustrated in FIG. 10A. In FIG. 10E, the control logic circuit 3 controls the transistor Q1 to be off state, and hence the light emitting diode D1 must be intrinsically lighted. However, because of the short-circuit abnormality in the light emitting diode D1, the light emitting diode D1 is not lighted. In addition, in FIG. 10E, the control logic circuit 3 controls the transistors Q2 to Q8 to be on state. Therefore, the output current $I_{OUT}$ of the driving circuit 1 flows in the short-circuited light emitting diode D1 and the transistors Q2 to Q8, and hence the light emitting diodes D1 to D8 are not lighted. Note that the state illustrated in FIG. 10E can be said to be one type of ground fault state because the output terminal of the driving circuit 1 is short-circuited to the ground through the light emitting diode D1 and the transistors Q2 to Q8, but it is not the state where a ground fault occurs without a short-circuit switch in the ground fault path.

In the state illustrated in FIG. 10D, i.e., in the state where a ground fault occurs without a short-circuit switch in the ground fault path, the output current $I_{OUT}$ of the driving circuit 1 continuously and wastefully flows to the ground regardless of the on or off state of the transistors Q2 to Q8. In addition, in the state illustrated in FIG. 10D, i.e., in the state where a ground fault occurs without a short-circuit switch in the ground fault path, current flows in an unexpected ground fault path, and hence there is a risk that a user may touch the ground fault path.

In contrast, in the state illustrated in FIG. 10C or in the state illustrated in FIG. 10E, i.e., in the state where a ground fault occurs with short-circuit switches in the ground fault path, the ground fault disappears if the on or off states of the transistors Q2 to Q8 are changed. Therefore, the wasteful flow of the output current $I_{OUT}$ from the driving circuit 1 to the ground is temporary. In addition, in the state illustrated in FIG. 10C or in the state illustrated in FIG. 10E, i.e., in the state where a ground fault occurs with short-circuit switches in the ground fault path, the ground fault path is along wiring, and hence the user may not touch the ground fault path, which is safe.

Therefore, it is desired that a ground fault with a short-circuit switch in the ground fault path can be discriminated from a ground fault without a short-circuit switch in the ground fault path, and that the ground fault without a short-circuit switch in the ground fault path can be detected.

Here, JP-A-2012-71712 discloses an LED driving device including an LED ground fault detection unit. However, if the LED ground fault detection unit disclosed in JP-A-2012-71712 is simply applied to the light emitting device illustrated in FIG. 10A, there is a problem that all the states illustrated in FIG. 10C to FIG. 10E are detected as a ground fault.

SUMMARY OF THE INVENTION

It is an object of the present invention to provide a ground fault detection circuit, and an abnormality detection circuit, a light emitting device, and a vehicle each using the ground fault detection circuit, which can detect a ground fault without a short-circuit switch in the ground fault path by discriminating it from a ground fault with a short-circuit switch in the ground fault path.

One example of a ground fault detection circuit disclosed in this specification detects a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches. The ground fault detection circuit includes an input portion to which an anode voltage of the series connection unit is input, and a ground fault determination unit arranged to determine that a ground fault has occurred without a short-circuit switch in the ground fault path, when the anode voltage of the series connection unit input through the input portion is equal to or smaller than a predetermined value that is smaller than the product of an on-resistance of one of the short-circuit switches and output current of the light emitting element driving circuit.

Another example of the ground fault detection circuit disclosed in this specification detects a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches. The ground fault detection circuit includes N short-circuit detection circuits arranged respectively to detect short-circuits in the light emitting elements, and a ground fault determination unit arranged to determine that a ground fault has occurred without a short-circuit switch in the ground fault path, if all the N short-circuit detection circuits detect that short-circuits have occurred in all the N light emitting elements when the switch control unit makes all the N short-circuit switches be in off state.

An example of an abnormality detection circuit disclosed in this specification includes the ground fault detection circuit of the one example described above, N short-circuit detection circuits arranged respectively to detect short-circuits in the light emitting elements, and a short-circuit determination unit arranged to determine that a short circuit has occurred, if at least one of the short-circuit detection circuits detects that a short circuit has occurred in the light emitting element when the switch control unit makes all the N short-circuit switches be in off state.

Another example of the abnormality detection circuit disclosed in this specification includes the ground fault detection circuit of the another example, and a short-circuit determination unit arranged to determine that a short circuit has occurred, if at least one of the short-circuit detection circuits detects that a short circuit has occurred in the light emitting element when the switch control unit makes all the N short-circuit switches be in off state.

A light emitting device disclosed in this specification includes the ground fault detection circuit having any one of the structures described above or the abnormality detection circuit having any one of the structures described above, a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches.

A vehicle disclosed in this specification includes the light emitting device having the structure described above.

The meanings and effects of the present invention will become more apparent from the description of an embodiment given below. However, the embodiment described below is merely an embodiment of the present invention, and meanings of the present invention and terms of structural components are not limited to those described in the following embodiment.

DETAILED DESCRIPTION OF THE PREFERRED EMBODIMENTS

First Structural Example

Figure 1:
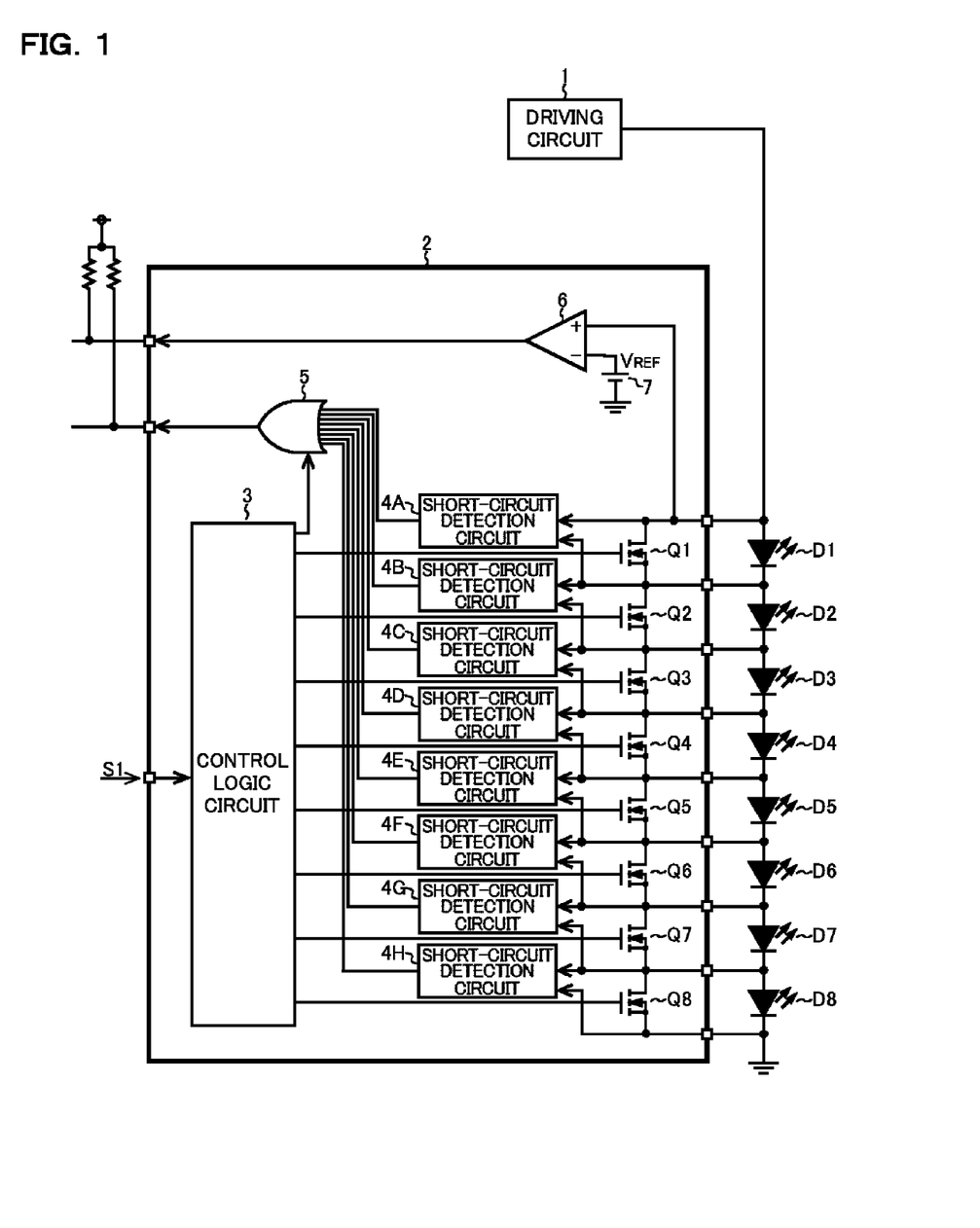
FIG. 1 is a diagram illustrating a first structural example of a light emitting device.

FIG. 1 is a diagram illustrating a first structural example of a light emitting device. The light emitting device illustrated in FIG. 1 includes a series connection unit constituted of eight light emitting diodes D1 to D8, a driving circuit 1 that drives the light emitting diodes D1 to D8, and a lighted element number control IC (integrated circuit) 2 that controls the number of lighted elements in the light emitting diodes D1 to D8. The lighted element number control IC 2 includes N-channel MOS field-effect transistors Q1 to Q8, a control logic circuit 3 that controls on and off of the transistors Q1 to Q8 in accordance with a lighted element number indicating signal S1 supplied externally, short-circuit detection circuits 4A to 4H, an OR gate 5, a comparator 6, and a reference voltage source 7. Note that, in the structural example of FIG. 1, the number of the light emitting diodes, the number of the transistors as short-circuit switches, and the number of the short-circuit detection circuits are each eight, but the number may be two or more without limiting to eight.

The driving circuit 1 is, for example, a series regulator that supplies a constant current to a load connected to its output terminal, a switching regulator that supplies a pulse width modulated (PWM) current having a predetermined on-duty to a load connected to its output terminal, or the like.

The anode of the series connection unit constituted of the light emitting diodes D1 to D8 (anode of the light emitting diode D1) is connected to the output terminal of the driving circuit 1. The cathode of the series connection unit constituted of the light emitting diodes D1 to D8 (cathode of the light emitting diode D8) is connected to the ground.

The both ends of the series connection unit constituted of the light emitting diodes D1 to D8 and each connection node between the light emitting diodes are connected to the lighted element number control IC 2, so that a transistor Qk (k is a natural number equal to or smaller than eight) is connected in parallel to a light emitting diode Dk (k is a natural number equal to or smaller than eight). In this way, the transistor Qk is the short-circuit switch for the light emitting diode Dk. In addition, an external terminal of the lighted element number control IC 2, to which the drain of the transistor Q1 is connected, is an input portion to which an anode voltage of the series connection unit constituted of the light emitting diodes D1 to D8 (anode voltage of the light emitting diode D1) is input.

The control logic circuit 3 controls each gate-source voltage of the transistors Q1 to Q8 so as to control on and off of the transistors Q1 to Q8. Therefore, although not illustrated in FIG. 1, in reality, not only the gates of the transistors Q1 to Q8 but also sources of the transistors Q1 to Q8 are connected to the control logic circuit 3.

The short-circuit detection circuit 4A checks whether or not an anode-cathode voltage of the light emitting diode D1 is substantially zero when the transistor Q1 is in off state. If it is substantially zero, the short-circuit detection circuit 4A detects a short circuit in the light emitting diode D1 so as to output a low level signal. If a short circuit in the light emitting diode D1 is not detected, the short-circuit detection circuit 4A outputs a high level signal. Therefore, although not illustrated in FIG. 1, in reality, the control logic circuit 3 sends a signal for notifying a state of the transistor Q1 to the short-circuit detection circuit 4A. In the same manner, the short-circuit detection circuits 4B to 4H detect short-circuits in the light emitting diodes D2 to D8, respectively.

The OR gate 5 takes a logical OR of the signals supplied from the short-circuit detection circuits 4A to 4H, in which high level is "0" while low level is "1". Further, if at least one of the signals supplied from the short-circuit detection circuits 4A to 4H is low level when the transistors Q1 to Q8 are in off state, the OR gate 5 outputs a low level signal indicating that a short circuit has been determined to occur. Therefore, when the transistors Q1 to Q8 are off state, the control logic circuit 3 enables the OR gate 5 to perform the logical OR operation. When at least one of the transistors Q1 to Q8 is in on state, the control logic circuit 3 disables the OR gate 5 to perform the logical OR operation, and makes the output of the OR gate 5 be in an open state. In order that the external terminal of the lighted element number control IC 2, to which the output of the OR gate 5 is connected, becomes high level when the output of the OR gate 5 is in open state, a pull-up resistor is connected to the external terminal of the lighted element number control IC 2 to which the output of the OR gate 5 is connected.

The comparator 6 compares the anode voltage of the series connection unit constituted of the light emitting diodes D1 to D8 (anode voltage of the light emitting diode D1) with a reference voltage $V_{REF}$ generated by the reference voltage source 7. If the anode voltage of the light emitting diode D1 is higher than the reference voltage $V_{REF}$, the comparator 6 outputs a high level signal. If the anode voltage of the light emitting diode D1 is equal to or lower than the reference voltage $V_{REF}$, the comparator 6 outputs a low level signal. The reference voltage $V_{REF}$ is set to be lower than the product of an on-resistance of one of the transistors Q1 to Q8 (smallest on-resistance if the transistors Q1 to Q8 have different on-resistances) and output current of the driving circuit 1 (average value of the PWM current if the output current is the PWM current).

When at least one of the light emitting diodes D1 to D8 is lighted (see FIGS. 10A and 10B), because the forward voltage of the lighted light emitting diode is higher than the product of the on-resistance of one of the transistors Q1 to Q8 and the output current of the driving circuit 1, the output signal of the comparator 6 becomes high level.

In addition, when the light emitting diodes D1 to D8 are not lighted and current is flowing in at least one of the transistors Q1 to Q8 (see FIGS. 10C and 10E), because the anode voltage of the light emitting diode D1 is higher than the product of the on-resistance of one of the transistors Q1 to Q8 and the output current of the driving circuit 1, the output signal of the comparator 6 becomes high level. In other words, when a ground fault occurs with one of the transistors Q1 to Q8 in the ground fault path, the output signal of the comparator 6 becomes high level.

On the other hand, when a ground fault occurs without any of the transistors Q1 to Q8 in the ground fault path (see FIG. 10D), because current does not flow in any of the transistors Q1 to Q8, the output signal of the comparator 6 becomes low level. In other words, when a ground fault occurs without any of the transistors Q1 to Q8 in the ground fault path, the output signal of the comparator 6 becomes low level.

In this way, the comparator 6 can detect a ground fault without any of the transistors Q1 to Q8 in the ground fault path by discriminating it from a ground fault with one of the transistors Q1 to Q8 in the ground fault path, and outputs a low level signal indicating that a ground fault without any of the transistors Q1 to Q8 in the ground fault path is detected when it is detected.

There is no particular limitation about how to use the low level signal that can be output from the OR gate 5 and the low level signal that can be output from the comparator 6. However, in consideration that current flows in an unexpected ground fault path in a state where a ground fault occurs without any of the transistors Q1 to Q8 in the ground fault path, and hence there is a risk that the user may touch the ground fault path, it is preferred to enhance safety measures more in the case where the comparator 6 outputs the low level signal than in the case where the OR gate 5 outputs the low level signal. For example, it is considered that when the OR gate 5 outputs the low level signal, a notifying unit (not shown) notifies the user that a short circuit has occurred while continuing operation of the driving circuit 1, but in contrast, when the comparator 6 outputs the low level signal, the notifying unit (not shown) notifies the user that a ground fault without any of the transistors Q1 to Q8 in the ground fault path has occurred while stopping operation of the driving circuit 1.

Second Structural Example

Figure 2:
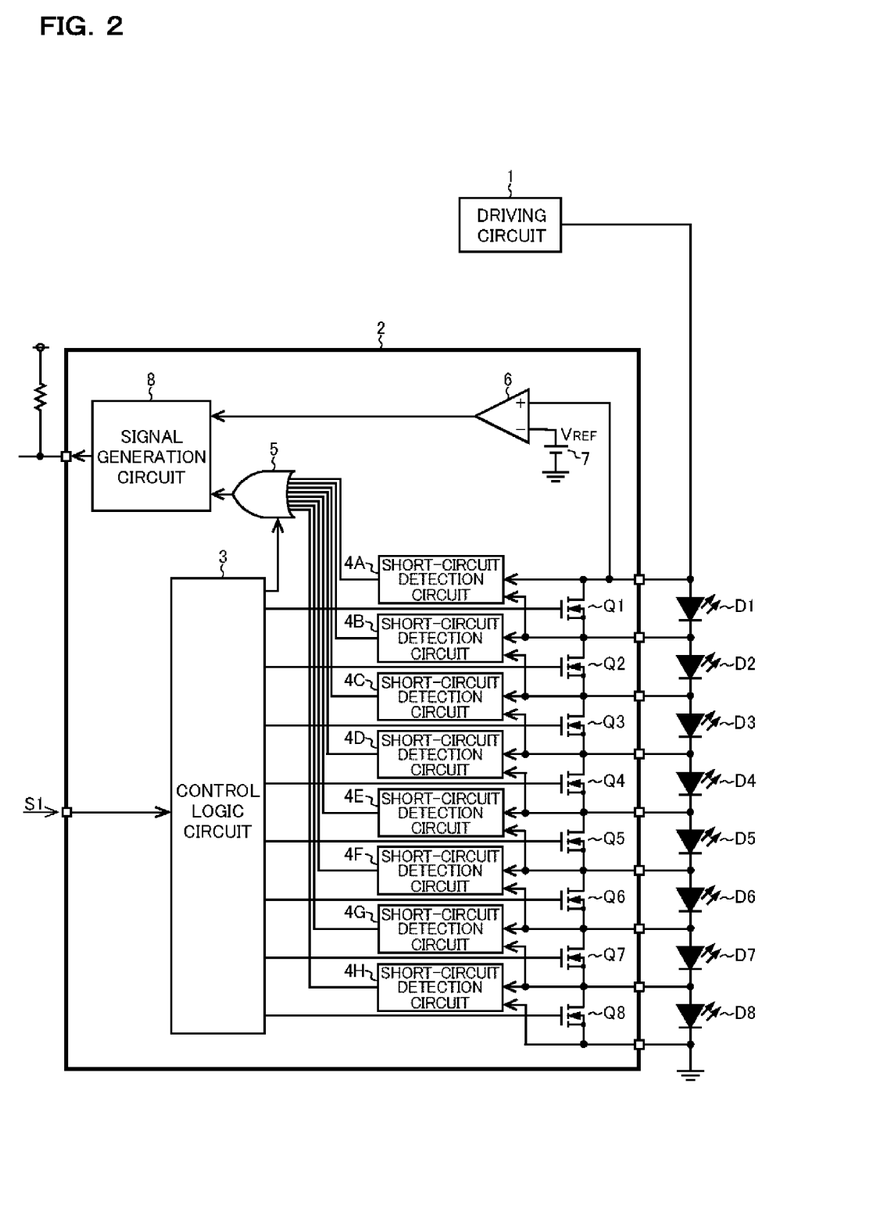
FIG. 2 is a diagram illustrating a second structural example of the light emitting device.

FIG. 2 is a diagram illustrating a second structural example of the light emitting device. The light emitting device illustrated in FIG. 2 has a structure in which a signal generation circuit 8 is added to the light emitting device illustrated in FIG. 1, and the signal generation circuit 8 is disposed inside the lighted element number control IC 2.

The signal generation circuit 8 generates an abnormality detection signal based on the output signal of the comparator 6 and the output signal of the OR gate 5, and externally outputs the abnormality detection signal.

When the output signal of the comparator 6 is a low level signal (indicating that a ground fault without any of the transistors Q1 to Q8 in the ground fault path is detected), the signal generation circuit 8 makes the abnormality detection signal be a signal having a first waveform (e.g. a low level signal).

When the output signal of the comparator 6 is not a low level signal (indicating that a ground fault without any of the transistors Q1 to Q8 in the ground fault path is detected) and the output signal of the OR gate 5 is a low level signal (indicating that a short circuit has occurred), the signal generation circuit 8 makes the abnormality detection signal be a signal having a second waveform different from the first waveform (e.g. a pulse signal).

The light emitting device illustrated in FIG. 2 achieves the same effect as the light emitting device illustrated in FIG. 1. In addition, the light emitting device illustrated in FIG. 2 can eliminate one external terminal of the lighted element number control IC 2 from the light emitting device illustrated in FIG. 1, because the signal generation circuit 8 generates one abnormality detection signal from the output signal of the comparator 6 and the output signal of the OR gate 5.

Third Structural Example

Figure 3:
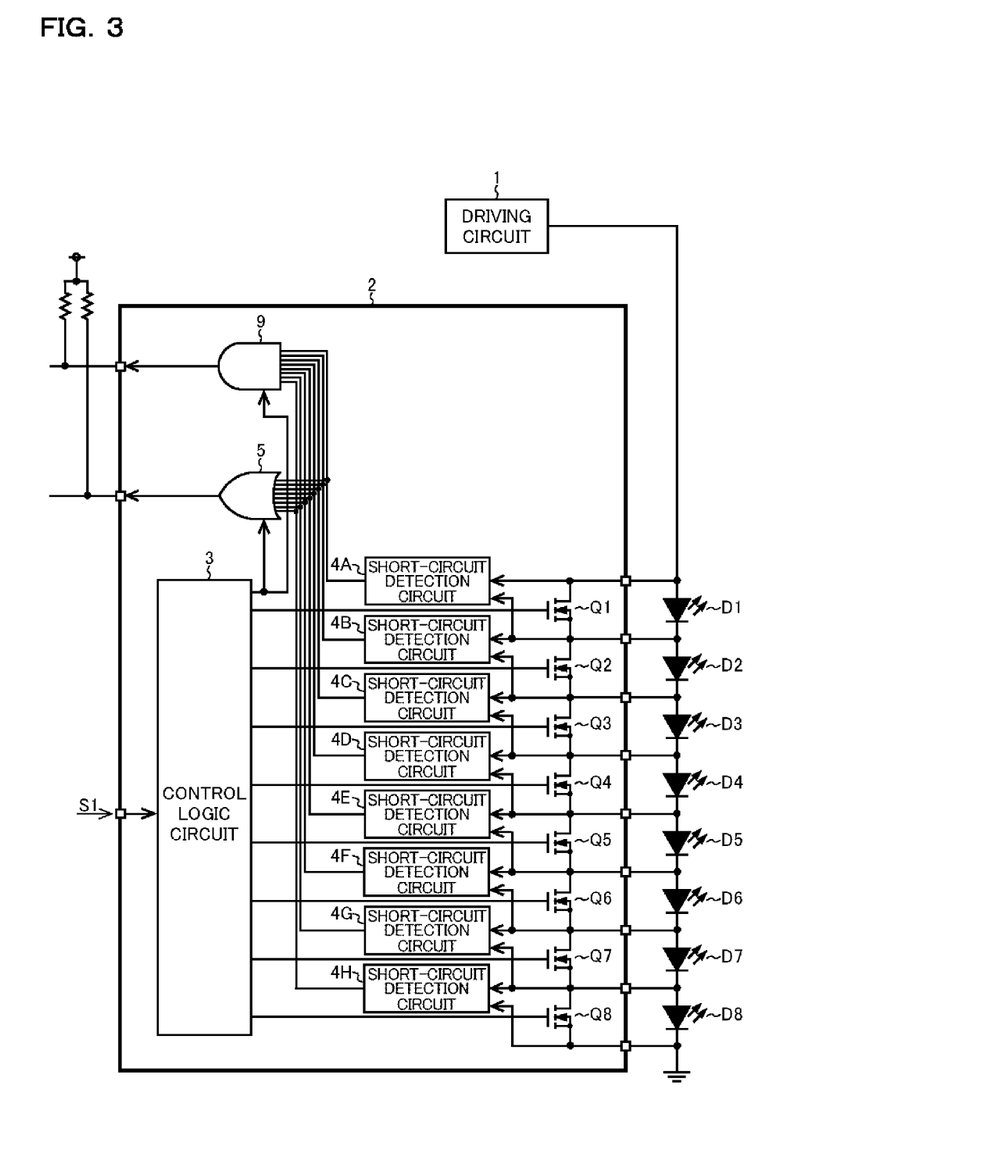
FIG. 3 is a diagram illustrating a third structural example of the light emitting device.

FIG. 3 is a diagram illustrating a third structural example of the light emitting device. The light emitting device illustrated in FIG. 3 has a structure in which the comparator 6 and the reference voltage source 7 are eliminated from the light emitting device illustrated in FIG. 1 while an AND gate 9 is added to the same, and the AND gate 9 is disposed inside the lighted element number control IC 2.

The AND gate 9 takes a logical AND of the signals supplied from the short-circuit detection circuits 4A to 4H, in which high level is "0" while low level is "1". Further, if all the signals supplied from the short-circuit detection circuits 4A to 4H are low level when the transistors Q1 to Q8 are in off state, the AND gate 9 outputs a low level signal. Therefore, when the transistors Q1 to Q8 are in off state, the control logic circuit 3 enables the AND gate 9 to perform the logical AND operation. When at least one of the transistors Q1 to Q8 is in on state, the control logic circuit 3 disables the AND gate 9 to perform the logical AND operation, and makes the output of the AND gate 9 be in an open state. In order that the external terminal of the lighted element number control IC 2, to which the output of the AND gate 9 is connected, becomes high level when the output of the OR gate 5 is in an open state, a pull-up resistor is connected to the external terminal of the lighted element number control IC 2 to which the output of the AND gate 9 is connected.

When at least one of the light emitting diodes D1 to D8 is lighted (see FIGS. 10A and 10B), because the lighted light emitting diode is not short-circuited, the output signal of the AND gate 9 becomes high level.

In addition, when the light emitting diodes D1 to D8 are not lighted and current flows in at least one of the transistors Q1 to Q8 (see FIGS. 10C and 10E), because at least one the transistors Q1 to Q8 is in on state, the AND gate 9 does not perform the logical AND operation so that the output of the AND gate 9 becomes an open state.

On the other hand, when a ground fault occurs without any of the transistors Q1 to Q8 in the ground fault path (see FIG. 10D), all the light emitting diodes D1 to D8 are short-circuited. Therefore, when all the transistors Q1 to Q8 are in the off state, the AND gate 9 performs the logical AND operation, and the output signal of the AND gate 9 becomes low level. When at least one of the transistors Q1 to Q8 is in the on state, the AND gate 9 does not perform the logical AND operation, and the output of the AND gate 9 becomes the open state.

In this way, the AND gate 9 can detect a ground fault without any of the transistors Q1 to Q8 in the ground fault path by discriminating it from a ground fault with one of the transistors Q1 to Q8 in the ground fault path, and outputs a low level signal indicating that a ground fault without any of the transistors Q1 to Q8 in the ground fault path is detected when it is detected. In other words, the light emitting device illustrated in FIG. 3 achieves the same effect as the light emitting device illustrated in FIG. 1.

Fourth Structural Example

Figure 4:
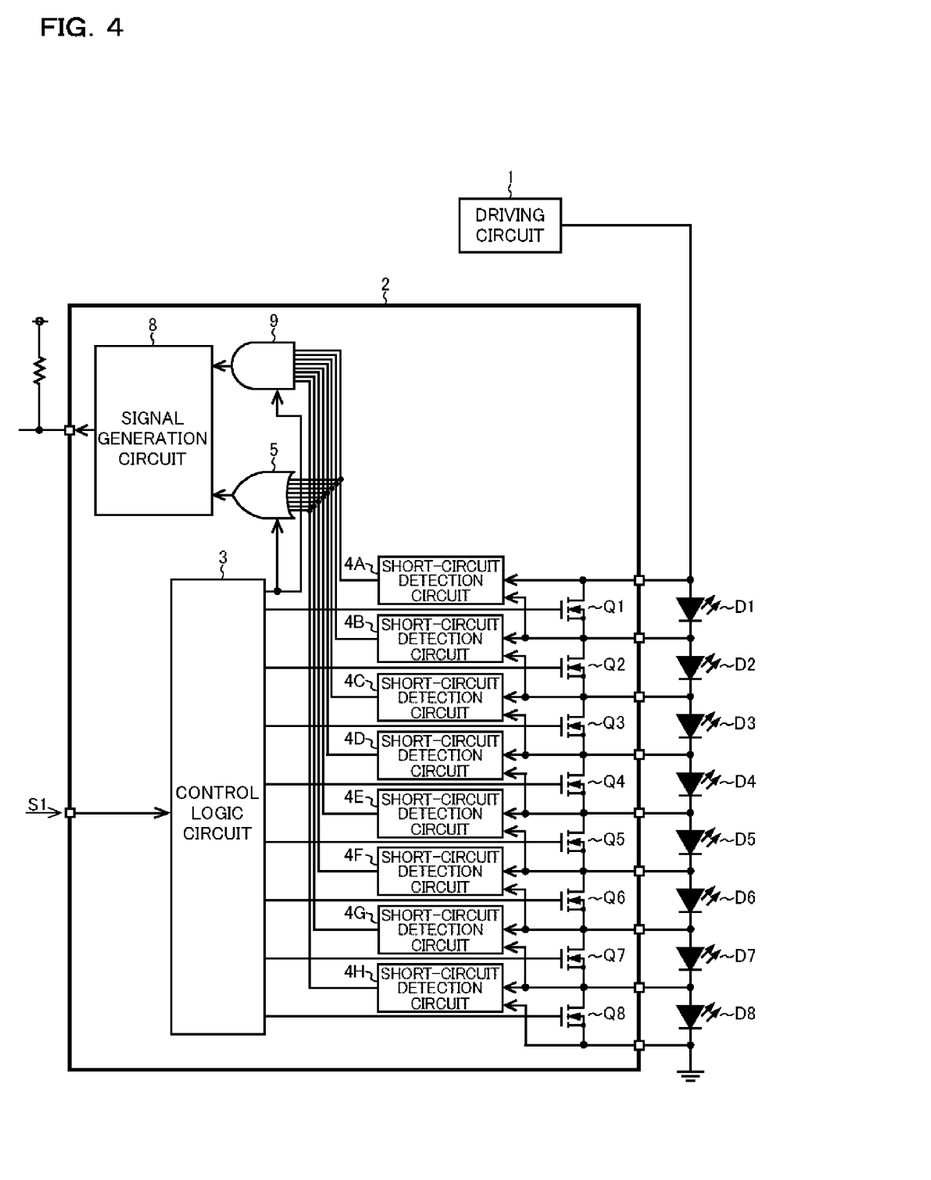
FIG. 4 is a diagram illustrating a fourth structural example of the light emitting device.

FIG. 4 is a diagram illustrating a fourth structural example of the light emitting device. The light emitting device illustrated in FIG. 4 has a structure in which the signal generation circuit 8 is added to the light emitting device illustrated in FIG. 3, and the signal generation circuit 8 is disposed inside the lighted element number control IC 2.

The signal generation circuit 8 generates an abnormality detection signal based on the output signal of the AND gate 9 and the output signal of the OR gate 5, and externally outputs the abnormality detection signal.

When the output signal of the AND gate 9 is a low level signal (indicating that a ground fault without any of the transistors Q1 to Q8 in the ground fault path is detected), the signal generation circuit 8 makes the abnormality detection signal be a signal having a first waveform (e.g. a low level signal).

When the output signal of the AND gate 9 is not a low level signal (indicating that a ground fault without any of the transistors Q1 to Q8 in the ground fault path is detected) and the output signal of the OR gate 5 is a low level signal (indicating that a short circuit has occurred), the signal generation circuit 8 makes the abnormality detection signal be a signal having a second waveform different from the first waveform (e.g. a pulse signal).

The light emitting device illustrated in FIG. 4 achieves the same effect as the light emitting device illustrated in FIG. 3. In addition, the light emitting device illustrated in FIG. 4 can eliminate one external terminal of the lighted element number control IC 2 from the light emitting device illustrated in FIG. 3, because the signal generation circuit 8 generates one abnormality detection signal from the output signal of the AND gate 9 and the output signal of the OR gate 5.

<Application>

Figure 5:
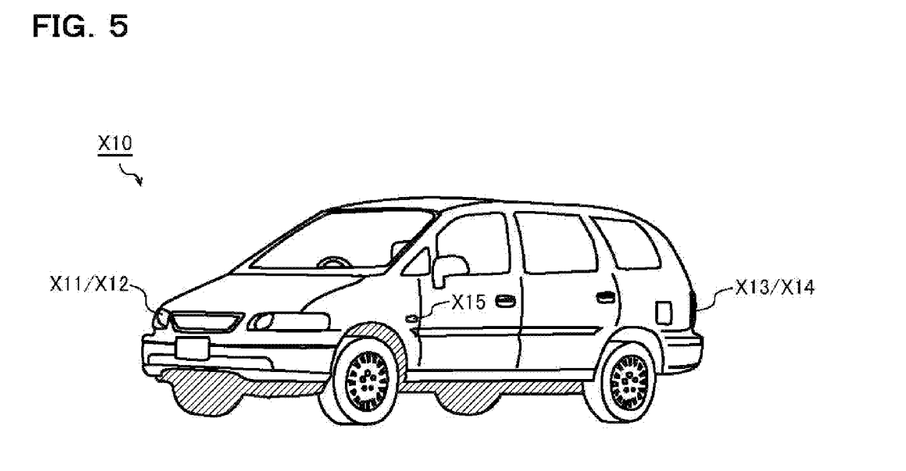
FIG. 5 is an external view (front) of a vehicle in which the light emitting device is mounted.
Figure 6:
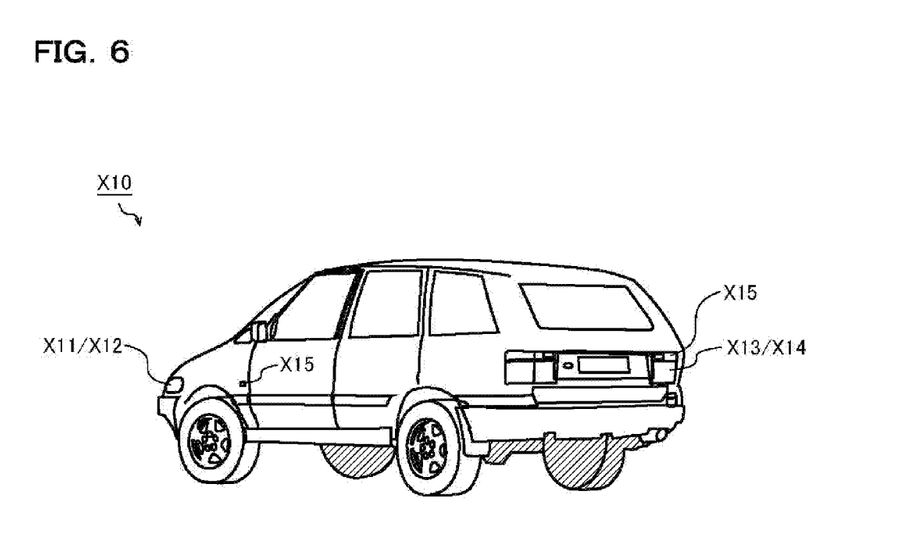
FIG. 6 is an external view (rear) of the vehicle in which the light emitting device is mounted.

The light emitting device described above can be used appropriately as illustrated in FIGS. 5 and 6, for example, as a headlight of a vehicle X10 (appropriately including a high beam, a low beam, a small lamp, a fog lamp, or the like) X11, a day and night running (DRL) light source X12, a tail lamp (appropriately including a small lamp, a back lamp, or the like) X13, a stop lamp X14, a turn lamp X15, or the like.

Figure 7:
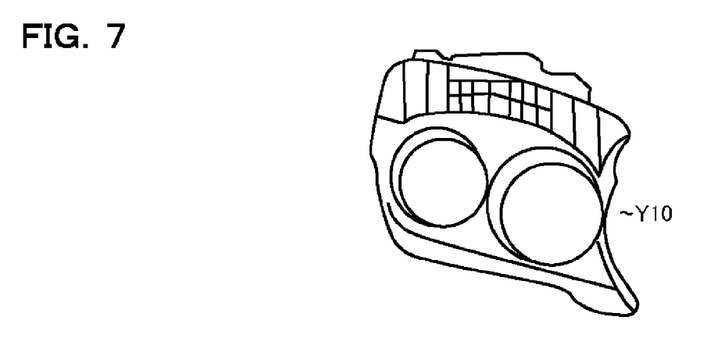
FIG. 7 is an external view of an LED headlight module.
Figure 8:
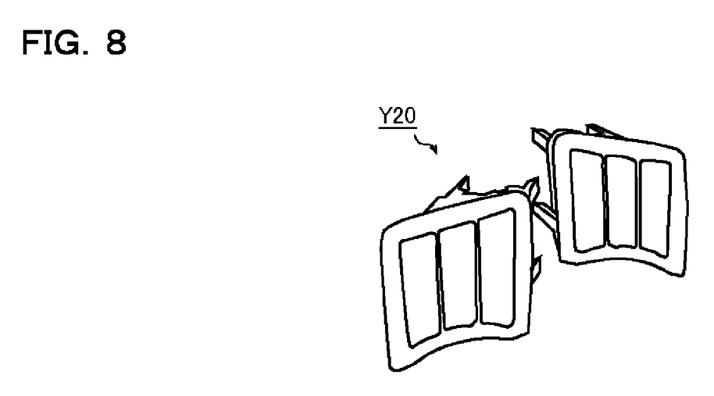
FIG. 8 is an external view of an LED turn lamp module.
Figure 9:
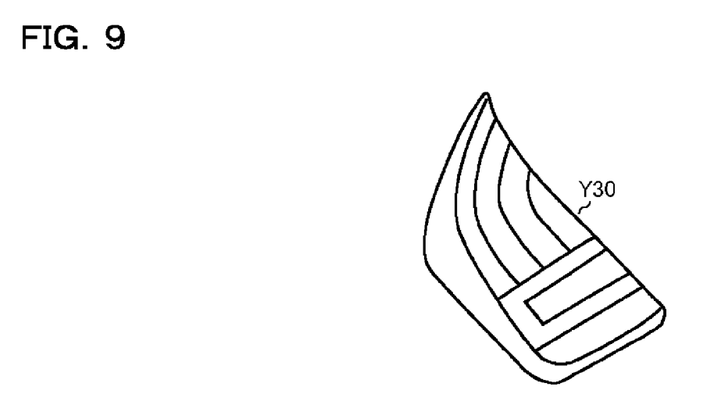
FIG. 9 is an external view of an LED rear lamp module.

Note that the light emitting device described above may be provided as a module (such as an LED head light module Y10 of FIG. 7, an LED turn lamp module Y20 of FIG. 8, or an LED rear lamp module Y30 of FIG. 9). In addition, it may be provided as a driving device having a function of controlling the number of light emitting elements, which is a semifinished product in which the light emitting diodes D1 to D8 and the external components of the driving circuit 1 are eliminated from the light emitting device described above.

In addition, the light emitting device described above can be used as a backlight of a display device, for example.

<Other Variations>

Note that the embodiment described above exemplifies the structure in which the light emitting diode is used as the light emitting element, but the present invention is not limited to this structure. For example, it is possible to use an organic electro-luminescence (EL) element as the light emitting element.

In addition, other than the embodiment described above, various technical features disclosed in this specification can be variously modified within the scope without deviating from the spirit of the technical invention. For example, it is possible to remove the transistors Q1 to Q8 from the lighted element number control IC 2, and to put the transistors Q1 to Q8 and the lighted element number control IC 2 without the transistors Q1 to Q8 in separate semiconductor packages. In addition, for example, it is possible to remove the transistors Q1 to Q8 from the lighted element number control IC 2, and put the transistors Q1 to Q8 and the light emitting diodes D1 to D8 in a module. In addition, for example, it is possible to dispose a voltage divider circuit that divides the anode voltage of the series connection unit constituted of the light emitting diodes D1 to D8 (anode voltage of the light emitting diode D1), so as to supply an output of the voltage divider circuit to a noninverting input terminal of the comparator 6. In this case, the reference voltage $V_{REF}$ should have a value obtained by multiplying a set value in the embodiment described above by a voltage division ratio of the voltage divider circuit. In other words, the embodiment described above is merely an example in every aspect and should not be interpreted as a limitation. The technical scope of the present invention is defined not by the above description of the embodiment but by the claims, and should be understood to include all modifications within meaning and scope equivalent to the claims.

An example of the ground fault detection circuit described above detects a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches. The ground fault detection circuit includes an input portion to which an anode voltage of the series connection unit is input, and a ground fault determination unit arranged to determine that a ground fault has occurred without a short-circuit switch in the ground fault path, when the anode voltage of the series connection unit input through the input portion is equal to or smaller than a predetermined value that is smaller than the product of an on-resistance of one of the short-circuit switches and output current of the light emitting element driving circuit (first structure).

In addition, in the ground fault detection circuit of the first structure described above, the ground fault determination unit may include a reference voltage source arranged to generate a reference voltage having the predetermined value, and a comparator arranged to compare the anode voltage of the series connection unit with the reference voltage (second structure).

Another example of the ground fault detection circuit described above detects a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches. The ground fault detection circuit includes N short-circuit detection circuits arranged respectively to detect short-circuits in the light emitting elements, and a ground fault determination unit arranged to determine that a ground fault has occurred without a short-circuit switch in the ground fault path, if all the N short-circuit detection circuits detect that short-circuits have occurred in all the N light emitting elements when the switch control unit makes all the N short-circuit switches be in off state (third structure).

An example of the abnormality detection circuit described above includes the ground fault detection circuit of the first or second structure, N short-circuit detection circuits arranged respectively to detect short-circuits in the light emitting elements, and a short-circuit determination unit arranged to determine that a short circuit has occurred, if at least one of the short-circuit detection circuits detects that a short circuit has occurred in the light emitting element when the switch control unit makes all the N short-circuit switches be in off state (fourth structure).

Another example of the abnormality detection circuit described above includes the ground fault detection circuit of the third structure, and a short-circuit determination unit arranged to determine that a short circuit has occurred, if at least one of the short-circuit detection circuits detects that a short circuit has occurred in the light emitting element when the switch control unit makes all the N short-circuit switches be in off state (fifth structure).

In addition, the abnormality detection circuit of the fourth or fifth structure may further include a signal generation unit arranged to generate an abnormality detection signal based on an output signal of the ground fault determination unit and an output signal of the short-circuit determination unit, and may have a structure in which the signal generation unit generates the abnormality detection signals having different waveforms between a case where the output signal of the ground fault determination unit is a signal indicating a ground fault without a short-circuit switch in the ground fault path, and a case where the output signal of the ground fault determination unit is not the signal indicating a ground fault without a short-circuit switch in the ground fault path while the output signal of the short-circuit determination unit is a signal indicating a short-circuit (sixth structure).

The light emitting device described above includes the ground fault detection circuit having one of the first to third structures or the abnormality detection circuit having one of the fourth to sixth structures, a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches (seventh structure).

In addition, in the light emitting device of the seventh structure, the light emitting element may be a light emitting diode or an organic EL element (eighth structure).

In addition, in the light emitting device of the seventh or eighth structure, the light emitting device may be used as an in-vehicle lamp (ninth structure).

In addition, in the light emitting device of the ninth structure, the light emitting device may be mounted in a vehicle as a headlight module, a turn lamp module, or a rear lamp module (tenth structure).

The vehicle described above includes the light emitting device of the ninth or tenth structure (eleventh structure).

In addition, in the vehicle of the eleventh structure, the light emitting device may be used as at least one of a headlight, a day and night running light source, a tail lamp, a stop lamp, and a turn lamp (twelfth structure).

What is claimed is:

1. A ground fault detection circuit arranged to detect a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches, the ground fault detection circuit comprising:
    an input portion to which an anode voltage of the series connection unit is input; and
    a ground fault determination unit arranged to determine that a ground fault has occurred without a short-circuit switch in the ground fault path, when the anode voltage of the series connection unit input through the input portion is equal to or smaller than a predetermined value that is smaller than the product of an on-resistance of one of the short-circuit switches and output current of the light emitting element driving circuit.

2. The ground fault detection circuit according to claim 1, wherein the ground fault determination unit includes
    a reference voltage source arranged to generate a reference voltage having the predetermined value, and
    a comparator arranged to compare the anode voltage of the series connection unit with the reference voltage.

3. A ground fault detection circuit arranged to detect a ground fault of a light emitting device including a series connection unit constituted of N light emitting elements (N is a natural number equal to or larger than two), a light emitting element driving circuit having an output terminal connected to an anode of the series connection unit, N short-circuit switches respectively connected in parallel to the light emitting elements, and a switch control unit arranged to control on and off of the short-circuit switches, the ground fault detection circuit comprising:
    N short-circuit detection circuits arranged respectively to detect short-circuits in the light emitting elements; and
    a ground fault determination unit arranged to determine that a ground fault has occurred without a short-circuit switch in the ground fault path, if all the N short-circuit detection circuits detect that short-circuits have occurred in all the N light emitting elements when the switch control unit makes all the N short-circuit switches be in off state.

4. An abnormality detection circuit comprising:
    the ground fault detection circuit according to claim 1;
    N short-circuit detection circuits arranged respectively to detect short-circuits in the light emitting elements; and
    a short-circuit determination unit arranged to determine that a short circuit has occurred, if at least one of the short-circuit detection circuits detects that a short circuit has occurred in the light emitting element when the switch control unit makes all the N short-circuit switches be in off state.

5. An abnormality detection circuit comprising:
    the ground fault detection circuit according to claim 3; and
    a short-circuit determination unit arranged to determine that a short circuit has occurred, if at least one of the short-circuit detection circuits detects that a short circuit has occurred in the light emitting element when the switch control unit makes all the N short-circuit switches be in off state.

6. The abnormality detection circuit according to claim 4, further comprising a signal generation unit arranged to generate an abnormality detection signal based on an output signal of the ground fault determination unit and an output signal of the short-circuit determination unit, wherein
    the signal generation unit generates the abnormality detection signals having different waveforms between a case where the output signal of the ground fault determination unit is a signal indicating a ground fault without a short-circuit switch in the ground fault path, and a case where the output signal of the ground fault determination unit is not the signal indicating a ground fault without a short-circuit switch in the ground fault path while the output signal of the short-circuit determination unit is a signal indicating a short-circuit.

7. The abnormality detection circuit according to claim 5, further comprising a signal generation unit arranged to generate an abnormality detection signal based on an output signal of the ground fault determination unit and an output signal of the short-circuit determination unit, wherein
    the signal generation unit generates the abnormality detection signals having different waveforms between a case where the output signal of the ground fault determination unit is a signal indicating a ground fault without a short-circuit switch in the ground fault path, and a case where the output signal of the ground fault determination unit is not the signal indicating a ground fault without a short-circuit switch in the ground fault path while the output signal of the short-circuit determination unit is a signal indicating a short-circuit.

8. A light emitting device comprising:
    the ground fault detection circuit according to claim 1;
    a series connection unit constituted of N light emitting elements (N is a natural number equal to or larger than two);
    a light emitting element driving circuit having an output terminal connected to an anode of the series connection unit;
    N short-circuit switches respectively connected in parallel to the light emitting elements; and a switch control unit arranged to control on and off of the short-circuit switches.

9. A light emitting device comprising:
the ground fault detection circuit according to claim 3;
a series connection unit constituted of N light emitting elements (N is a natural number equal to or larger than two);
a light emitting element driving circuit having an output terminal connected to an anode of the series connection unit;
N short-circuit switches respectively connected in parallel to the light emitting elements; and
a switch control unit arranged to control on and off of the short-circuit switches.

10. The light emitting device according to claim 8, wherein the light emitting element is a light emitting diode or an organic EL element.

11. The light emitting device according to claim 9, wherein the light emitting element is a light emitting diode or an organic EL element.

12. The light emitting device according to claim 8, wherein the light emitting device is used as an in-vehicle lamp.

13. The light emitting device according to claim 9, wherein the light emitting device is used as an in-vehicle lamp.

14. The light emitting device according to claim 12, wherein the light emitting device is mounted in a vehicle as a headlight module, a turn lamp module, or a rear lamp module.

15. The light emitting device according to claim 13, wherein the light emitting device is mounted in a vehicle as a headlight module, a turn lamp module, or a rear lamp module.

16. A vehicle comprising the light emitting device according to claim 12.

17. A vehicle comprising the light emitting device according to claim 13.

18. The vehicle arranged to claim 16, wherein the light emitting device is used as at least one of a headlight, a day and night running light source, a tail lamp, a stop lamp, and a turn lamp.

19. The vehicle arranged to claim 17, wherein the light emitting device is used as at least one of a headlight, a day and night running light source, a tail lamp, a stop lamp, and a turn lamp.

* * * * *